(12) United States Patent  
Horie

(10) Patent No.: US 6,731,227 B2  
(45) Date of Patent: May 4, 2004

(54) QWERTY TYPE TEN-KEY BOARD BASED CHARACTER INPUT DEVICE

(76) Inventor: Kenichi Horie, 3034, Hayano, Mobara-chi, Chiba 297-0037 (JP)

( * ) Notice: Subject to any disclaimer, the term of this patent is extended or adjusted under 35 U.S.C. 154(b) by 426 days.

(21) Appl. No.: 09/846,967

(22) Filed: May 1, 2001

(65) Prior Publication Data

US 2001/0048378 A1 Dec. 6, 2001

(30) Foreign Application Priority Data

Jun. 6, 2000 (JP) ........................................ 2000-209079

(51) Int. Cl.[7] ........................ H03K 17/94; H03M 11/00
(52) U.S. Cl. ........................ 341/22; 345/334; 379/368
(58) Field of Search ............................ 341/22; 345/168, 345/169, 334; 379/368

(56) References Cited

U.S. PATENT DOCUMENTS 5,128,672 A * 7/1992 Kaehler ..................... 341/23  
6,016,142 A * 1/2000 Chang et al. ............... 345/334

* cited by examiner

Primary Examiner—Timothy Edwards  
(74) Attorney, Agent, or Firm—Frishauf, Holtz, Goodman & Chick, P.C.

(57) ABSTRACT

A character input device which allows the user to input characters in a virtual qwerty arrangement on a mobile information device or a palm-sized information terminal. A mobile telephone or the like having a ten-key board is equipped with an inclination sensor or an angular velocity sensor for allocating the same arrangement of the qwerty type keyboard, divided into a left, a central and a right section, to the ten-key board of the mobile telephone depending on whether the mobile telephone is inclined to the left or to the right, or at a normal position. For a personal computer user or the like who has already memorized actually or latently the qwerty arrangement, actions for moving the mobile telephone to the left or right or horizontally have special meanings. Such physical motions causes the user to retrieve the image of the qwerty type keyboard so that they can rapidly input characters. If already familiar with the qwerty arrangement, the user can immediately input characters, not seeing a display or keys of the mobile telephone, without special practice. A user who has learned the qwerty arrangement with the mobile telephone, which embodies the present invention, can rapidly input characters on a personal computer.

7 Claims, 6 Drawing Sheets

Fig. 3A
Fig. 3B
Fig. 3C
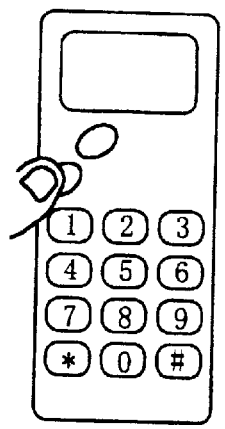
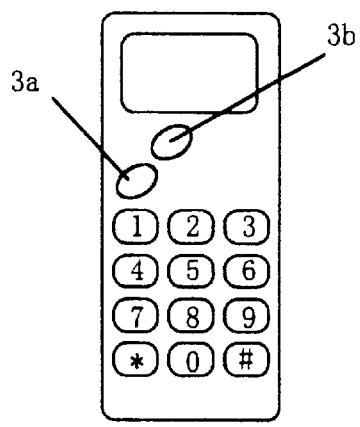
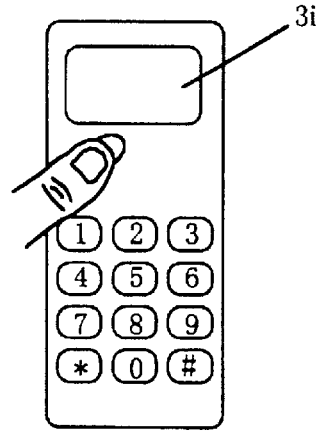
3c
3d
3e
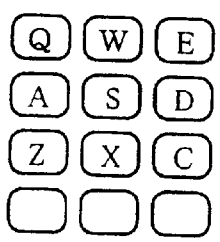
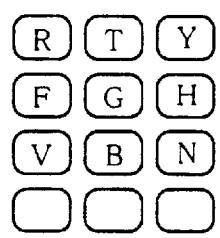
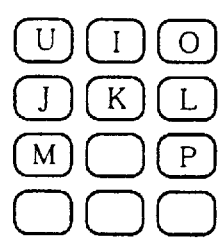
3f
3g
3h Fig. 4
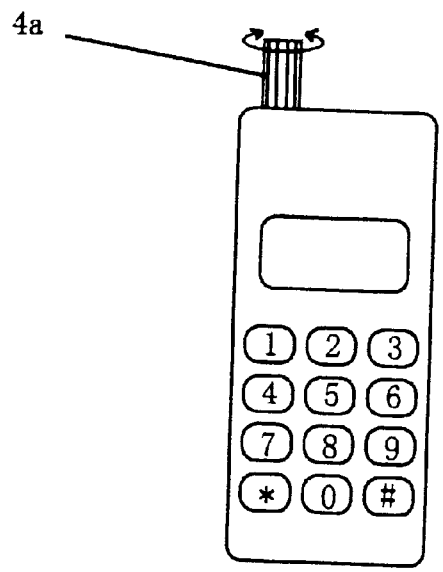
Fig. 5A
Fig. 5B
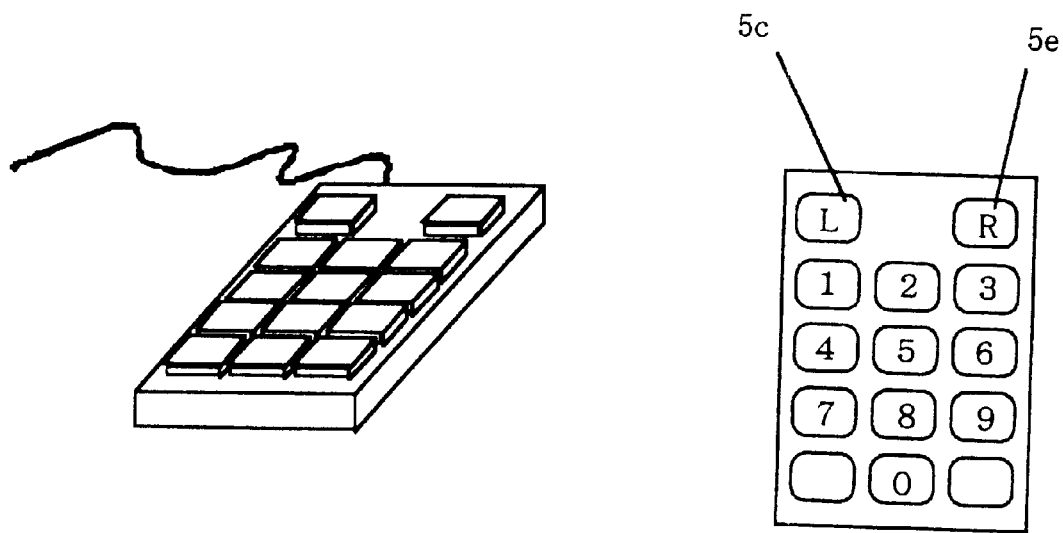

6c　　　　　6d　　　　　6e

QWERTY TYPE TEN-KEY BOARD BASED CHARACTER INPUT DEVICE

BACKGROUND OF THE INVENTION

1. Field of the Invention

The present invention relates to a palm-sized character input device based on a keyboard having ten numeral keys (hereinafter referred to as the "ten-key board") for use with a wireless information terminal such as a mobile telephone or a wired information terminal, which permits a user to input characters with one hand while holding the input device with the other hand.

2. Prior Art

Information terminals such as mobile telephones, which involve frequent inputting of numerals, are often used with an input device of a ten-key board type as illustrated in FIG. 2. The illustrated terminal has keys for inputting numerals from "0" to "9" with laterally three keys and vertically four lines and utilizes for inputting characters as well. The actual input method comprises allocating a plurality of alphabet letters to each of the numeral keys based on the alphabetic order, selecting a desired alphabet letter by depressing an associated key a plurality of number of times, and inputting the selected alphabet letter.

For example, when the numeral key "9" is depressed four times, an expressed character changes from "W", "X", "Y" to "Z" by each depression to select the character "Z".

A keyboard arranged in the qwerty order illustrated in FIG. 1 was devised in the 19th century, and is most widely spread over the world. Most of personal computers used in Japan also employ the same key arrangement. However, since a small-sized character input device for use with a mobile telephone or the like encounters difficulties in accommodating keys for 26 alphabet letters, the qwerty arrangement cannot be employed. Although personal computer users, in particular, usually input characters with both hands on a qwerty keyboard, they are forced to input alphabet letters on a small-sized character input device, which is directed by the present invention, based on the alphabetically ordered keys which however are not familiar to them. The users fully know the one-dimensional order of the alphabet letters from A to Z. However, the users must learn from the beginning the positions of alphabet letters allocated two-dimensionally on a keyboard.

SUMMARY OF THE INVENTION

It is therefore an object of the present invention to provide a ten-key board, having a less number of keys than a qwerty keyboard, which reproduces the input feeling on the qwerty keyboard that has been two-dimensionally memorized by personal computer users and so on.

According to the first embodiment of the present invention, there is provided a ten-key board type character input device for use with a wireless or a wired information terminal, which comprises:

ten keys provided on said character input device, a switching means for switching allocation of characters to the respective ten keys, a sensor for detecting a state of the switching allocation and an electronic circuit for switching the allocation of characters based on a signal from the sensor;

said switching means includes three switching functions to reproduce the qwerty arrangement, said three switching functions comprising:

a first switching function for allocating 9 characters positioned lateral 3 keys and vertical 3 lines on the left side of 26 characters in the qwerty arrangement to lateral 3 keys and vertical 3 lines at the same positions on said ten-key board among lateral 3 keys and vertical 4 lines of the ten-key board;

a second switching function for allocating 9 characters positioned in a central portion of the 26 characters in the qwerty arrangement to the keys on said ten-key board; and a third switching function for allocating the remaining 8 characters on the right side of the qwerty arrangement to the keys on said ten-key board.

According to the second embodiment of the present invention, there is provided a ten-key board type character input system having the above system, wherein:

said sensor for detecting the state of the switching allocation is an inclination sensor or an angular velocity sensor provided at the character input device; and said inclination sensor or said angular velocity sensor for sensing whether said character input device is inclined to the left or to the right or is at a normal position;

said electronic circuit controls said switching means to reproduce the predetermined number of characters on the left side of the qwerty arrangement on said ten-key board when said sensor senses that said character input device is inclined to the left, to reproduce the predetermined number of characters in the central portion of the qwerty arrangement when said sensor senses that said character input device is at the normal position, and to reproduce the remaining characters on the right side of the qwerty arrangement when said sensor senses that said character input device is inclined to the right.

BRIEF DESCRIPTION OF THE DRAWINGS

FIG. 3A to FIG. 3C each illustrates a character input device using a shift key according to one embodiment of the present invention;

FIG. 4 illustrates a character input device using a rotary encoder system according to one embodiment of the present invention;

FIG. 5A and FIG. 5B each illustrates a character input device using a candidate finalizing key system according to one embodiment of the present invention;

DESCRIPTION OF THE PREFERRED EMBODIMENTS

According to the first and the second embodiments, the present invention provides a character input device which has three switching functions, for example, as shown in FIG. 3B, a device 3d having shift keys 3a and 3b, or as shown in FIG. 4, a device having a rotary encoder 4a, the character to be input is changed as shown in 3f, 3g and 3h in FIGS. 3A to 3C to virtually reproduce the image of the qwerty arrangement on the character input device.

Unlike the one-dimensionally memorized alphabetic arrangement, this is a two-dimensional image so that users who are accustomed to the qwerty arrangement can learn manipulations on the character input device of the present invention in a short time.

For users who cannot input keys of a personal computer having less experience, they have necessarily a certain memory of arrangement of the key-board with a certain extent so that good skill can be obtained within a short period of time. Also, it is not necessary to press the same key repeatedly so that operation can be done lightly.

Figure 1:
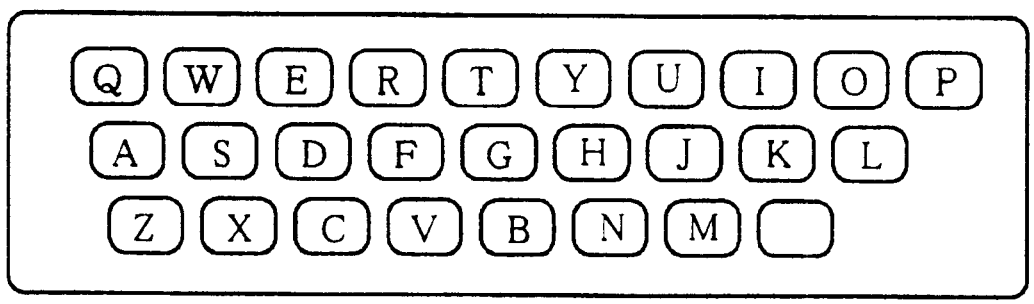
FIG. 1 illustrates a qwerty arranged keyboard.
Figure 2:
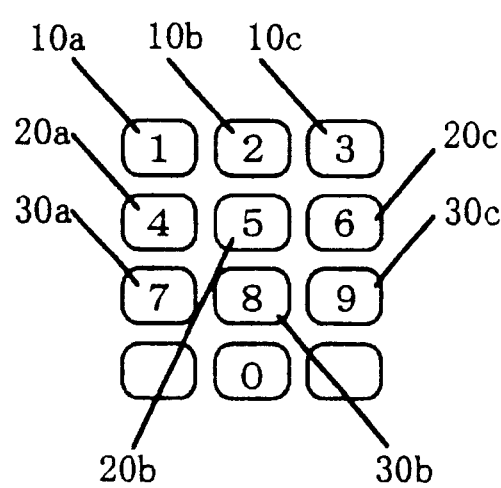
FIG. 2 illustrates an outer appearance of a mobile telephone equipped with a ten-key board.

Incidentally, the character "P" alone is left when the characters are divided into three groups so that it is arranged at unoccupied 30c or 30b shown in FIG. 2 which is the exceptional character. This does not cause significant trouble for users since the character "P" is inherently positioned at an end.

Also, for users who have no experience of inputting characters on a qwerty arranged keyboard, once they get accustomed to inputting characters on the character input device of the present invention, they can readily input on the qwerty arranged keyboard, if they operate personal computers with a full keyboard in the future. This advantageously encourages such users to learn input manipulations on the character input device of the present invention.

Figure 6:
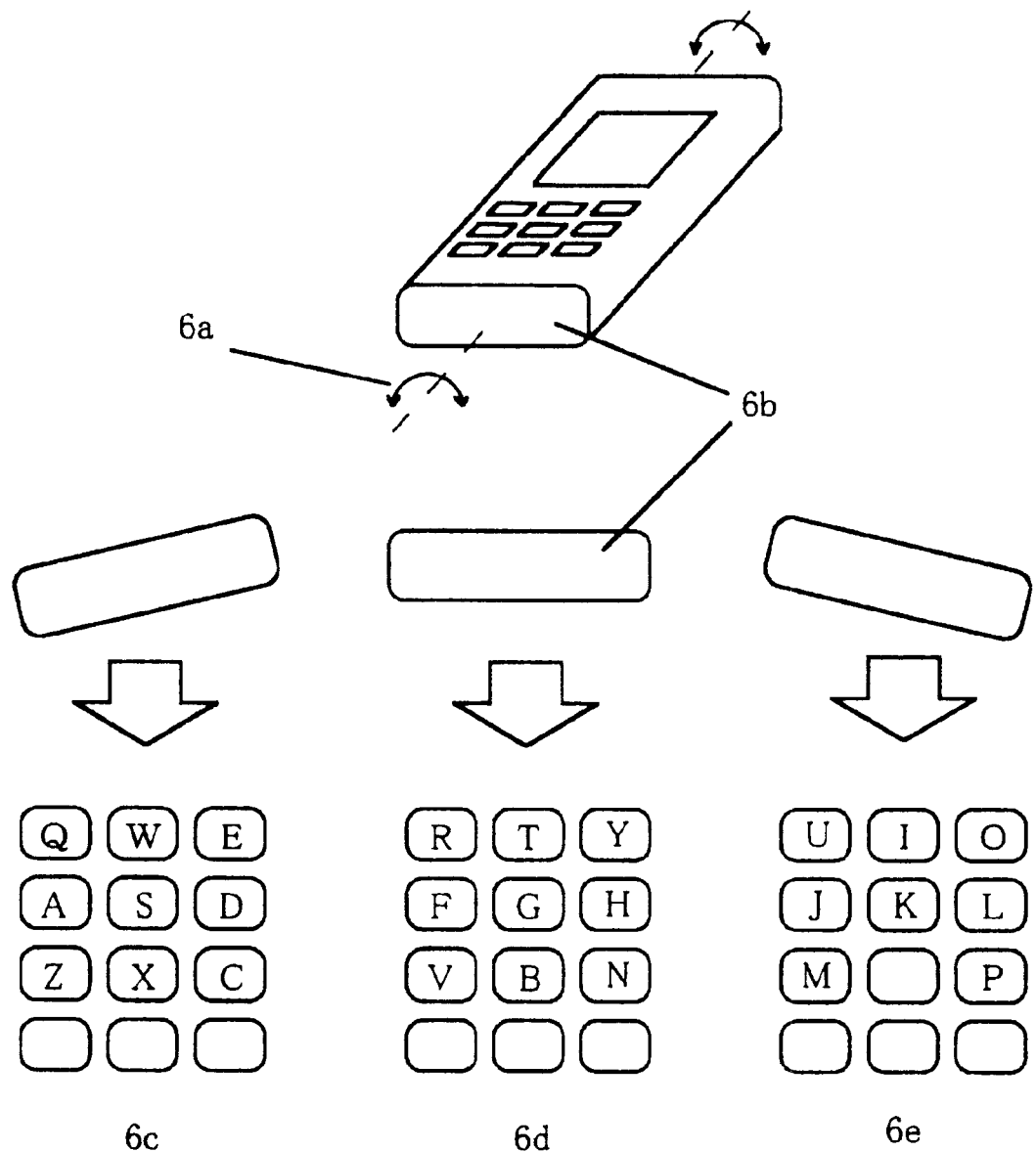
FIG. 6 illustrates a motion of a character input device using an inclination sensor system according to one embodiment of the present invention.

According to the device of the third embodiment of the present invention, the user turns a wrist to incline the input device held by the hand to the left or to the right in order to reproduce the qwerty arrangement on the ten-key board as shown by an arrow 6a in FIG. 6. According to this operation, characters capable of inputting can be divided into three kinds as shown in 6c, 6d and 6e shown in FIG. 6.

The foregoing operation has a special meaning. Control means allocates a left 6c, a right 6e and a central section 6d of a qwerty arranged keyboard to the ten-key board in response to the user's physical motion for inclining the character input device to the left or to the right or holding the same horizontally. A user who is accustomed to inputting characters on a qwerty arranged keyboard can relate the control means to the user's physical motions, thereby retrieving the memorized key arrangements in the left, central and right sections as actual or latent images. Therefore, the user can learn rapid inputting manipulation after a short term of practice.

This is an effect which cannot be provided by a character input device which only has means for switching characters to be input by inclining the character input device.

Like the qwerty type keyboard, one character is input by pressing a key once, so that the user can have the same feeling as that when he inputs a character on the conventional qwerty type keyboard.

In the following, explanation will be made with regard to input of the Japanese characters.

When the Japanese characters are to be input by the Roman alphabet, it is necessary to input a vowel after a consonant from a Japanese alphabet at the "ka" column of the kana syllabary to the "wa" column of the same.

According to one embodiment of the present invention, when the third switching of the above-mentioned device has carried out, an input position of the character "O" which can be input at the right side upper position of the ten-key board is arranged to the position other than the positions at which the characters "A", "I", "U" and "E" are input. In this device, the input position of the character "O" is present at 7e shown in FIG. 7A which is different from the positions 10a, 10b, 10c and 20a shown in FIG. 2 at which the characters "A", "I", "U" and "E" can input, respectively.

According to this constitution, after inputting the consonant by effecting the third switching, According to another embodiment of the present invention, when the Japanese character is to be input, after selecting a consonant, the device has a function that an input position of the character "O" is moved to an input position other than the positions at which the characters "A", "I", "U" and "E" are input.

Still further embodiment of the present invention, two candidates-finalizing keys are provided to the ten-key board and one of three kinds of candidates thinkable by the ten-key operations input immediately before and after the input is determined by the finalizing keys.

Still further embodiment of the present invention, when a shift key to which a function of selecting one of three kinds of candidates simultaneously input of the ten-key board is provided is solely pressed and released, it acts as the candidate-finalizing key and one of three kinds of candidates thinkable by the ten-key operations input immediately before and after the input is determined again by the shift key.

EXAMPLES

Example 1

Function switching switches 3a and 3b are provided to a ten-key board. As shown in 3c shown in FIG. 3A, when the switch 3a (see FIG. 3B) is continued to press, an electronic circuit such as a microcomputer provided at the ten-key board or a personal computer which receives a signal from the ten-key board arranges an arrangement at the left side of a qwerty key-board. At this time, when the ten-key board is pressed with another finger, a character at the position can be input. Also, when the switch 3b (see FIG. 3B) is continued to press as shown in FIG. 3C, an arrangement at the left side of the qwerty key-board is selected, and if the ten-key board is pressed with another finger, a character at the position can be input. When neither the switches 3a and 3b is pressed, an arrangement at the center position of the qwerty key-board is selected.

This operation is the first input and one character is firstly selected from 26 English-characters.

Figure 7A:
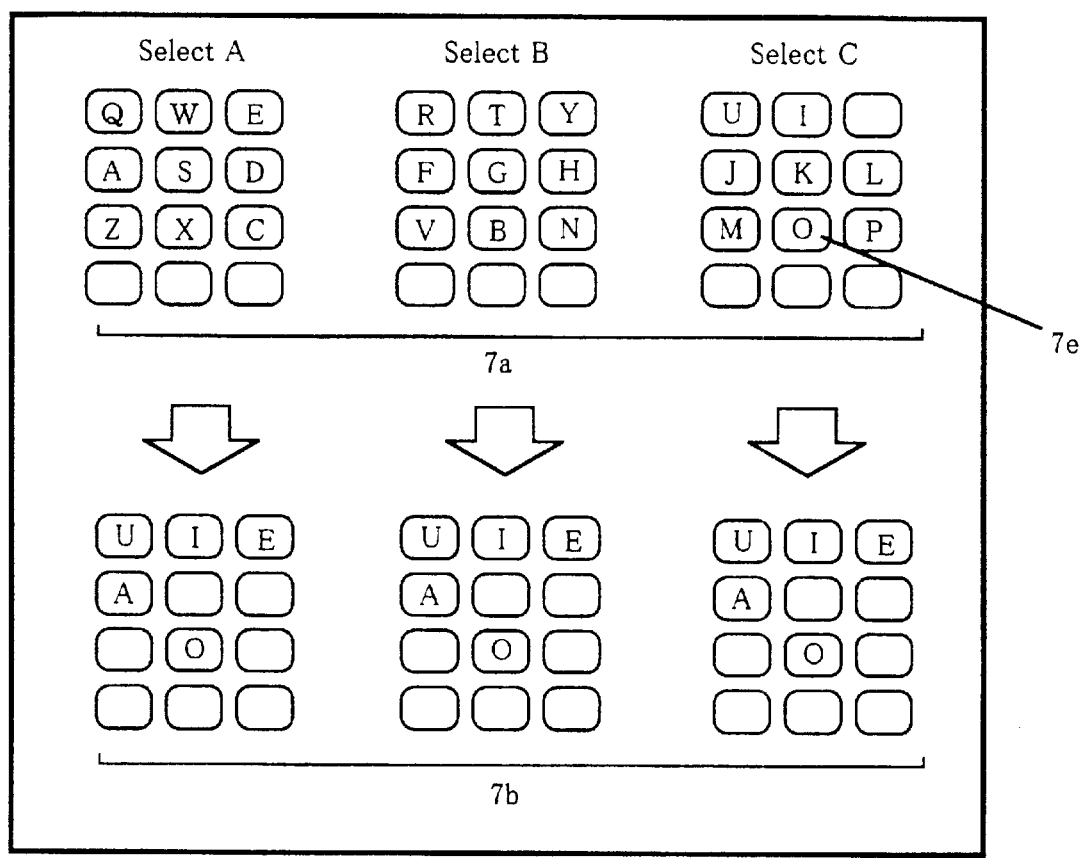
FIG. 7A and FIG. 7B each illustrates a vowel input mode when the Japanese characters are to be input according to one embodiment of the present invention.
Figure 7B:
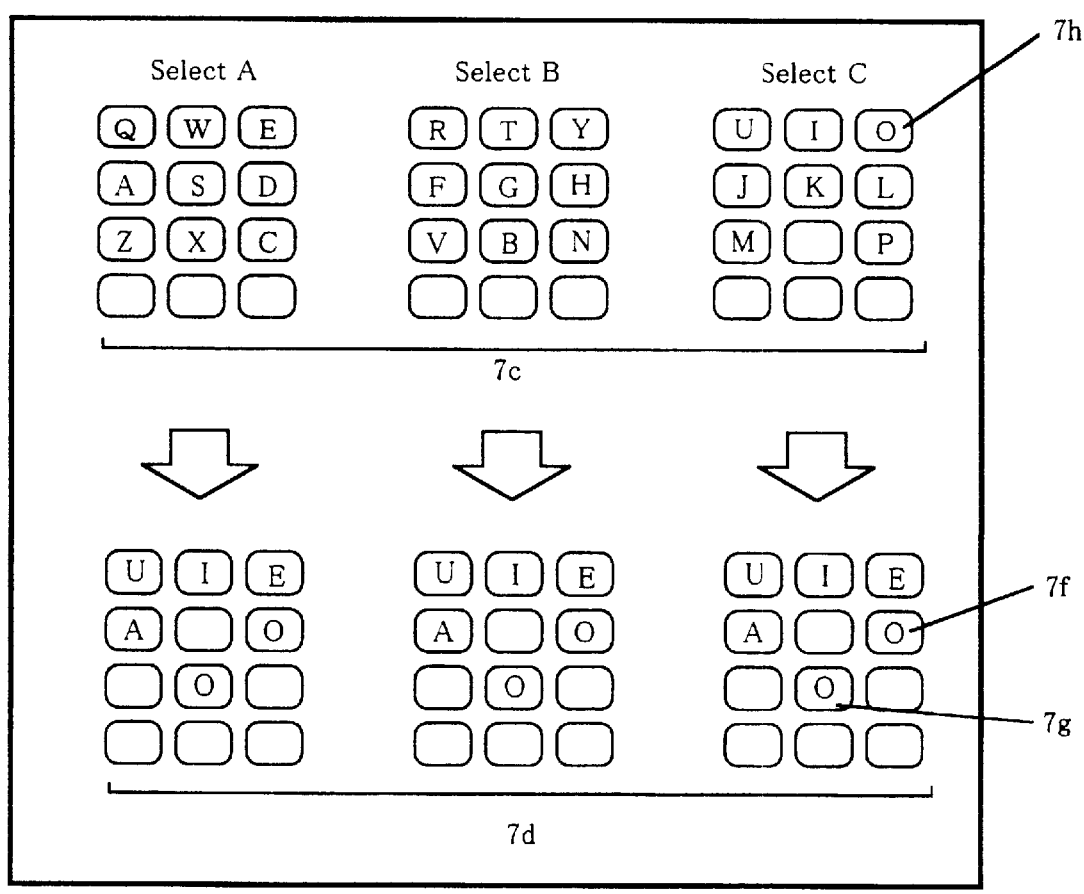

When the Japanese characters are to be input, a vowel is input at the second press and as shown in FIG. 7A, an arrangement shown in 7b, an objective vowel can be selected only by pressing ten-key board irrespective of the switches 3a and 3b.

Example 2

A mobile information device such as PDA (personal digital assistant) equipped with an inclination sensor as illustrated in FIG. 6 is inclined by a physical motion of a user for turning a hand. In this event, a microcomputer contained in the device senses a normal position or left or right inclination by information from the inclination sensor to switch sets of characters corresponding to the keys on the ten-key board as illustrated in 6c, 6d and 6e of FIG. 6. The switching may be made by a mechanical switch or an electronic logic circuit rather than the microcomputer.

It should be noted that the normal position, as the basis for the sensing, is not limited to the exactly horizontal state but may be at any position as long as the user can recognize the inclination of the ten-key board to the left or to the right from the normal position.

Example 3

Assume now that a user inputs an address for an e-mail on a mobile terminal. First, the user imagines the qwerty arrangement. Supposing that the user wants to input the letter "Q" at the upper left corder of the keyboard, the user inclines the mobile telephone to the left. Upon sensing the inclination, the microcomputer allocates a set of characters corresponding to the qwerty keyboard arrangement to the keys on the ten-key board as 6c in FIG. 6, so that the user types the key at the upper left corder, just like the user types a keyboard of a personal computer.

A personal computer user who is accustomed to inputting characters on a qwerty arranged keyboard has already memorized actually or latently this arrangement, he can input characters rapidly with one hand. If sufficiently familiar with the qwerty arrangement, the user can blind input characters without learning.

For users who have no experience of inputting characters on a qwerty arranged keyboard, on the other hand, once they get accustomed to inputting characters on the input device of the present invention, they can readily input on the qwerty arranged keyboard, if they are to operate personal computers in the future. This encourages such users to learn input manipulations on the character input device of the present invention, so that they can readily learn to input characters on this character input device.

What is claimed is:

1. A ten-key board type character input device for use with a wireless or a wired information terminal, which comprises:

ten keys provided on said character input device, a switching means for switching allocation of characters to the respective ten keys, and a sensor for detecting a state of the switching allocation and an electronic circuit for switching the allocation of characters based on a signal from the sensor;

wherein said switching means includes three switching functions to reproduce a qwerty arrangement, and said three switching functions comprise:

a first switching function for allocating 9 characters positioned at 3 lateral keys and 3 vertical lines on a left side of 26 characters in the qwerty arrangement to 3 lateral keys and 3 vertical lines at same positions on said ten-key board among lateral keys and 4 vertical lines of the ten-key board;

a second switching function for allocating 9 characters positioned in a central portion of the 26 characters in the qwerty arrangement to the keys on said ten-key board; and a third switching function for allocating 8 remaining characters on a right side of the qwerty arrangement to the keys on said ten-key board;

wherein said sensor for detecting the state of the switching allocation comprises one of an inclination sensor and an angular velocity sensor provided at the character input device;

wherein said one of said inclination sensor and said angular velocity sensor senses whether said character input device is one of inclined to the left, inclined to the right and at a normal position; and wherein said electronic circuit controls said switching means (i) to reproduce a predetermined number of characters on the left side of the qwerty arrangement on said ten-key board when said sensor senses that said character input device is inclined to the left, (ii) to reproduce the predetermined number of characters in the central portion of the qwerty arrangement when said sensor senses that said character input device is at the normal position, and (iii) to reproduce the remaining characters on the right side of the qwerty arrangement when said sensor senses that said character input device is inclined to the right.

2. The ten-key board type character input device according to claim 1, wherein the third switching function of said switching means allocates an input position of the character "O" at an upper right side position of the ten-key board and at a position other than positions at which the characters "A", "I", "U" and "E" are input.

3. The ten-key board type character input device according to claim 1, further comprising a function to move an input position of the character "O", wherein when a Japanese character is to be input, after selecting a consonant, the input position of the character "O" is moved to an input position other than positions at which the characters "A", "I", "U" and "E" are input.

4. The ten-key board type character input device according to claim 1, further comprising two candidates-finalizing keys to determine one of three candidates inputtable by a key immediately before and after an input by the key.

5. The ten-key board type character input device according to claim 1, further comprising a shift key to select one of three kinds of candidates simultaneously inputtable by the ten-key board, wherein when the shift key is solely pressed and released, it determines one of three candidates inputtable by a key immediately before and after an input by the key.

6. The ten-key board type character input device according to claim 1, wherein the electronic circuit comprises a microcomputer.

7. The ten-key board type character input device according to claim 1, wherein the electronic circuit comprises a personal computer.

* * * * *